United States Patent
Lin et al.

(10) Patent No.: US 10,679,893 B2
(45) Date of Patent: Jun. 9, 2020

(54) INTERCONNECTION STRUCTURE AND METHOD OF FORMING THE SAME

(71) Applicant: UNITED MICROELECTRONICS CORP., Hsin-Chu (TW)

(72) Inventors: Yu-Cheng Lin, Tainan (TW); Chich-Neng Chang, Pingtung County (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/121,605

(22) Filed: Sep. 4, 2018

(65) Prior Publication Data

US 2020/0075395 A1 Mar. 5, 2020

(51) Int. Cl.
*H01L 23/532* (2006.01)
*H01L 21/768* (2006.01)
*H01L 23/522* (2006.01)

(52) U.S. Cl.
CPC .... *H01L 21/7682* (2013.01); *H01L 21/76825* (2013.01); *H01L 21/76828* (2013.01); *H01L 21/76834* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| | | |
|---|---|---|
| 6,159,845 A | 12/2000 | Yew |
| 6,399,476 B2 | 6/2002 | Kim |
| 2005/0179135 A1 | 8/2005 | Kumar |
| 2018/0204801 A1* | 7/2018 | Tung ................. H01L 21/7682 |

* cited by examiner

*Primary Examiner* — Long Pham
(74) *Attorney, Agent, or Firm* — Winston Hsu

(57) ABSTRACT

An interconnection structure and method of forming the same are disclosed. A substrate is provided. A patterned layer is formed on the substrate and having at least a trench formed therein. A first dielectric layer is then formed on the patterned layer and sealing an air gap in the trench. Subsequently, a second dielectric layer is formed on the first dielectric layer and completely covering the patterned layer and the air gap. A curing process is then performed to the first dielectric layer and the second dielectric layer. A volume of the air gap is increased after the curing process.

5 Claims, 5 Drawing Sheets

INTERCONNECTION STRUCTURE AND METHOD OF FORMING THE SAME

BACKGROUND OF THE INVENTION

1. Field of the Invention

The present invention relates to an interconnection structure and a method of forming the same, and more particularly to an interconnection structure having an air gap between two adjacent conductive structures.

2. Description of the Prior Art

As the features of integrated circuits (IC) devices are reduced to smaller sizes, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnection.

These difficulties can be mitigated by preparing the interconnection structure of the integrated circuit device using an inter-layer dielectric or an inter-metal dielectric having a dielectric constant that is as low as possible for reducing capacitive coupling and improving performance of future integrated circuits devices. Various low-k dielectric materials and manufacturing method have been developed and verified. However, there is always a need in the field to provide isolation between conductive structures with even lower dielectric constant for advanced applications.

SUMMARY OF THE INVENTION

One objective of the present invention is to provide an interconnection structure having an air gap formed between adjacent conductive structures.

According to an embodiment of the present invention, a method of forming an interconnection structure is disclosed. First, a substrate is provided. A patterned layer is then formed on the substrate. The patterned layer includes at least a trench formed therein. Subsequently, a first dielectric layer is formed on the patterned layer and seals an air gap in the trench, and a second dielectric layer is immediately formed on the first dielectric layer and completely covering the patterned layer. Afterward, a curing process is performed to the first dielectric layer and the second dielectric layer.

According to another embodiment of the present invention, an interconnection structure is disclosed. The interconnection structure includes a substrate and a patterned layer formed on the substrate. The patterned layer has at least a trench formed therein. A first dielectric layer is formed on the patterned layer and forming overhang features on upper corners of the trench. A second dielectric layer is formed on the first dielectric layer and completely covering the patterned layer and striding over the trench. An air gap is sealed in the trench and has a bottle-shaped profile. The air gap is in direct contact with the first dielectric layer and the second dielectric layer.

The air gap provided by the present invention may have its volume further enlarged by shrinkage of thickness of the first dielectric layer. The enlarged air gap may further reduce the overall dielectric constant of the isolation between the adjacent conductive structures and therefore the coupling interference between the adjacent conductive structures may be eliminated.

These and other objectives of the present invention will no doubt become obvious to those of ordinary skill in the art after reading the following detailed description of the preferred embodiment that is illustrated in the various figures and drawings.

DETAILED DESCRIPTION

In the following disclosure, details will be described with reference to the drawings. The contents of the drawings also form part of the detailed description of the specification, and are illustrated by way of specific examples in which the embodiment can be implemented. The following examples have described sufficient details to enable those of ordinary skill in the art to practice. Of course, other embodiments may be adopted, or any structural, logical, and electrical changes may be made without departing from the embodiments described herein. Therefore, the following detailed description should not be taken as limiting, but rather, the embodiments contained herein will be defined by the appended claims.

The term "air gap" as used herein refers to a void sealed in the insulating layer between conductive structures that may be a vacuum void or at least partially filled with air or inert gases.

The term "low-k dielectric material" as used herein refers to a dielectric material having a dielectric constant less than that of silicon oxide, which is about 3.9. The low-k dielectric materials used in the invention may include carbon-doped silicon dioxide materials, fluorinated silicate glass (FSG), organic polymeric thermoset materials, silicon oxycarbide, SiCOH dielectrics, fluorine doped silicon oxide, spin-on glasses, benzocyclobutene (BCB)-based polymer dielectrics, silsesquioxanes including hydrogen silsesquioxane (HSQ), methyl silsesquioxane (MSQ) and mixtures or copolymers of HSQ and MSQ, but not limited thereto.

Although in the following description, embodiments for forming air gaps in the trenches between adjacent conductive structures are described, the present invention may be applicable for forming air gaps in trenches between other semiconductor structures.

Figure 1:
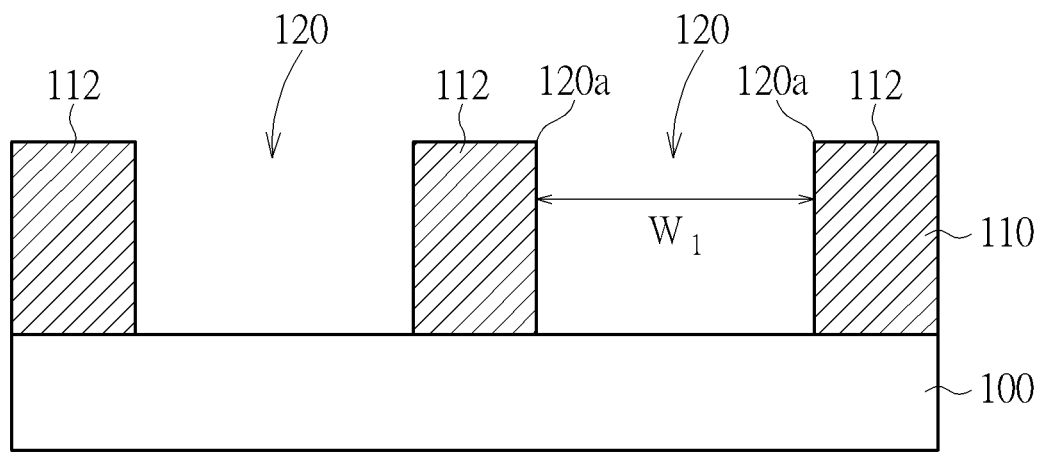
FIG. 1 to FIG. 5 are schematic diagrams illustrating a method for forming an interconnection structure according to a first embodiment of the present invention.

Please refer to FIG. 1 to FIG. 4, which are schematic diagrams illustrating the method for forming an interconnection structure according to a first embodiment of the present invention. As shown in FIG. 1, a substrate 100 is provided. The substrate 100 could be a semiconductor substrate such as a silicon substrate, an epitaxial substrate, a silicon carbide (SiC) substrate, a silicon-on-insulator (SOI) substrate, but not limited thereto. The substrate 100 may be a semi-fabricated substrate for forming an integrated circuits device. The substrate 100 may have semiconductor devices formed therein, such as metal-oxide semiconductor (MOS) transistors, diodes, bipolar junction transistors (BJTs), capacitors or other integrated circuit components. The substrate 100 may also have multiple material layers such as interlayer or intermetal dielectric layers and interconnection structures such as metal lines or vias formed therein. A patterned layer 110 is formed on the substrate 100. The patterned layer 110 may comprise a plurality of trenches 120 formed therein and at least a pair of conductive structures 112 separated by one of the trenches 120. The conductive structures 112 may include conductive materials such as metals selected from the group including tungsten (W), copper (Cu), aluminum (Al), titanium aluminide (TiAl) alloy, and cobalt tungsten phosphide (CoWP). Preferably, the conductive structures 112 are made of copper (Cu). The patterned layer 110 may be fabricated by, for example, forming a sacrificial layer (not shown) on the substrate 100 and forming the conductive structures 112 in the sacrificial layer. After that, at least the portion of the sacrificial layer between the conductive structures 112 is removed to form the trenches 120 between the conductive structures 112. Other methods such as performing a photolithography-etching process on a conductive material layer (not shown) to remove a portion of the conductive material layer to form the trenches 120 and define the conductive structures 112 by the trenches 120 may also be applicable in other embodiments. The conductive structures 112 may be respectively electrically connected to other interconnection structures such as metal lines or contacts/vias (not shown) or semiconductor devices (not shown) formed in the substrate 100. The trenches 120 between the conductive structures 112 may have a width $W_1$. When the width $W_1$ is small, capacitive coupling between the conductive structures 112 may occur when currents were conducted in the conductive structures 112. According to an embodiment, the trenches 120 may have a width $W_1$ ranging from 30 nm to 50 nm, but not limited thereto.

Figure 2:
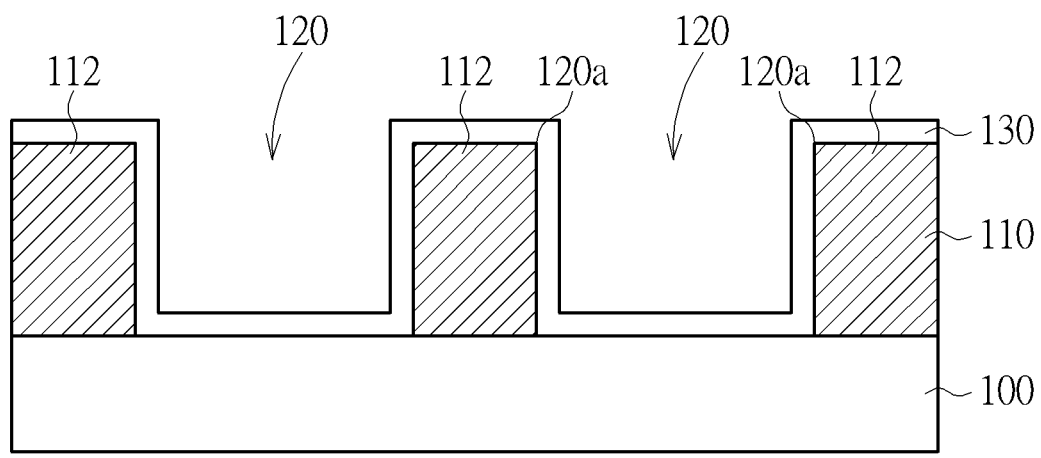

Please refer to FIG. 2. Subsequently, a barrier layer 130 is conformally formed on the patterned layer 110. The barrier layer 130 may be a dielectric layer formed by, for example, a chemical vapor deposition (CVD) process, a physical vapor deposition (PVD) process, or an atomic layer deposition (ALD) process. The barrier layer 130 may include one or multiple layers comprising nitride-doped silicon carbide (NDC), undoped silicon carbide (UDC), oxygen doped silicon carbide (ODC) or the like. The barrier layer 130 preferably has a good step coverage and conformally and uniformly covers the sidewalls and bottom surface of the trench 120. The barrier layer 130 may prevent the metal material (such as copper) of the conductive structures 112 from diffusing into the subsequently formed first dielectric layers 140 and second dielectric layer 150. The barrier layer 130 may also serve as an etching stop layer in a later process for defining other interconnection structures (not shown) in the first dielectric layer 140 and the second dielectric layer 150.

Figure 3:
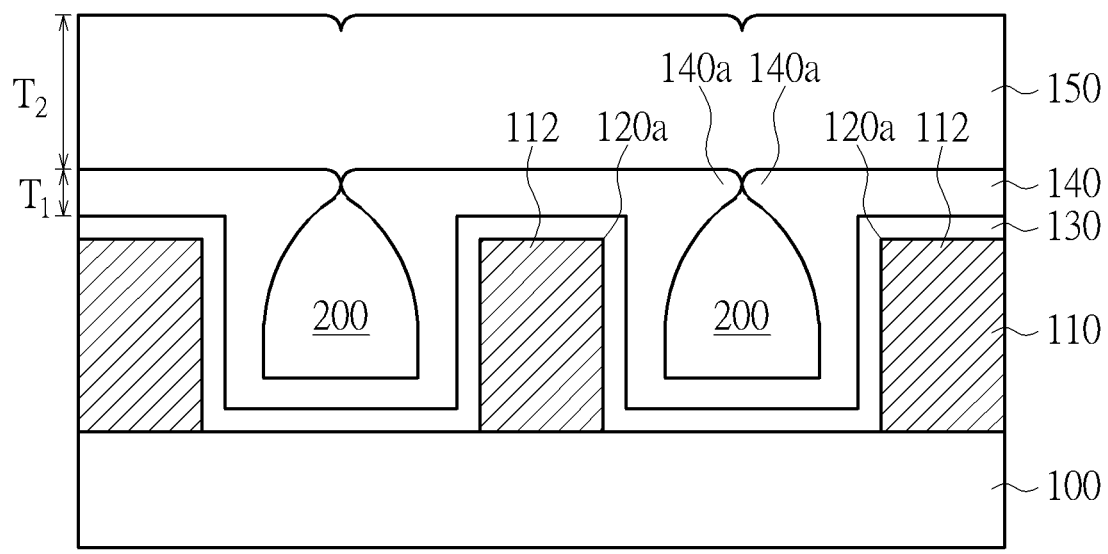

Please refer to FIG. 3. Afterward, a deposition process is performed to successively form a first dielectric layer 140 and a second dielectric layer 150 on barrier layer 130. Preferably, the deposition of the first dielectric layer 140 is formed with poor step coverage. Specifically, the first dielectric layer 140 deposited on the upper corners 120*a* of the trenches 120 grows much faster than the first dielectric layer 140 deposited on other region of the patterned layer 110 and in the trench 120. Accordingly, overhang features 140*a* of the first dielectric layer 140 are formed on the upper corners 120*a* of the trench 120. The overhang features 140*a* continue to grow toward each other as the formation of the first dielectric layer 140 until joining together, thereby sealing an air gap 200 in the trench 120 between the pair of conductive structures 112. A second dielectric layer 150 is then formed on the first dielectric layer 140, completely covering the patterned layer 110 and striding over the trench 120 without filling into the trenches 120. The thickness $T_1$ of the first dielectric layer 140 may depend on the width $W_1$ of the trench 120. Preferably, the thickness $T_1$ of the first dielectric layer 140 is at least more than half of the width $W_1$ of the trench 120. For example, when the width $W_1$ of the trench 120 ranges from 30 nm to 50 nm, the thickness $T_1$ (usually measured from a thickness monitor region on the substrate 100) of the first dielectric layer 140 may range from 150 angstroms to 300 angstroms, and preferably ranges from 300 angstroms to 500 angstroms, but not limited thereto. The second dielectric layer 150 is the major insulating layer between the patterned payer 110 and an overhead interconnection layer (not shown). The second dielectric layer 150 also serves as a planarizing layer to smooth the topography created by the patterned layer 110. The second dielectric layer 150 preferably has relatively better step coverage than the first dielectric layer 140. A thickness $T_2$ of the second dielectric layer 150 may range from hundreds to thousands angstroms according to process needs. According to the embodiment as shown in FIG. 3, a portion of the first dielectric layer 140 may fill into the trench 120, covering along the sidewalls and bottom surface of the trench 120.

Preferably, the first dielectric layer 140 and the second dielectric layer 150 may comprise organosilica glasses (OSG) dielectric materials, such as Black Diamond™ (available from Applied Materials), Aurora™ (available from ASM) or Coral™ (available from Novellus), but not limited thereto. The first dielectric layer 140 and the second dielectric layer 150 may be formed by performing a plasma-enhanced chemical vapor deposition (PECVD) process. According to a preferred embodiment, the first dielectric layer 140 and the second dielectric layer 150 are in-situ and sequentially formed in a same processing chamber (not shown), within a same thermal cycle, and from the same precursors. That is, the first dielectric layer 140 and the second dielectric layer are formed in a continuous deposition process. The precursors for forming the first dielectric layer 140 and the second dielectric layer 150 may include at least a organosilane (SiCOH) precursor for forming the bodies of the first dielectric layer 140 and the second dielectric layer 150 (which are precursor films of the first dielectric layer 142 and the second dielectric layer 152) and a porogen precursor for forming porogens (pore-forming agents) that are interspersed in the bodies of the first dielectric layer 140 and the second dielectric layer 150. The porogen precursor may include a thermal labile or ultraviolet labile hydrocarbon compound ($C_xH_y$). Other source gases such as oxidizing agents, adductive compound and inert carrying/diluting gases may also be supplied to the processing chamber when forming the first dielectric layer 140 and the second dielectric layer 150.

The deposition process for forming the first dielectric layer 140 and the second dielectric layer 150 may be a multiple-stage deposition process that includes a first deposition stage for forming the first dielectric layer 140 and a second deposition stage for immediately forming the second dielectric layer 150 on the first dielectric layer 140. The precursors for forming the first dielectric layer 140 and the second dielectric layer 150 may be supplied to the processing chamber in different flow rates during the first deposition stage and the second deposition stage. For example, the porogen precursor may be supplied to the processing chamber in a first flow rate during the first deposition stage and in a second flow rate during the second deposition stage. According to an embodiment, the first flow rate is higher than the second flow rate, and consequently a proportion of the porogens interspersed in the first dielectric layer 140 is higher than a proportion of the porogens interspersed in the second dielectric layer 150. Furthermore, the first deposition stage and the second deposition stage may have different radio frequency (RF) power. For example, the RF power of the first deposition stage may be higher than the RF power of the second deposition stage to result in a higher deposition rate and poor step coverage of the first dielectric layer 140 with respect to the second dielectric layer 150. According to an embodiment, the multiple-stage deposition process may be varied out at a temperature between 25° C. to 500° C.

Figure 4:
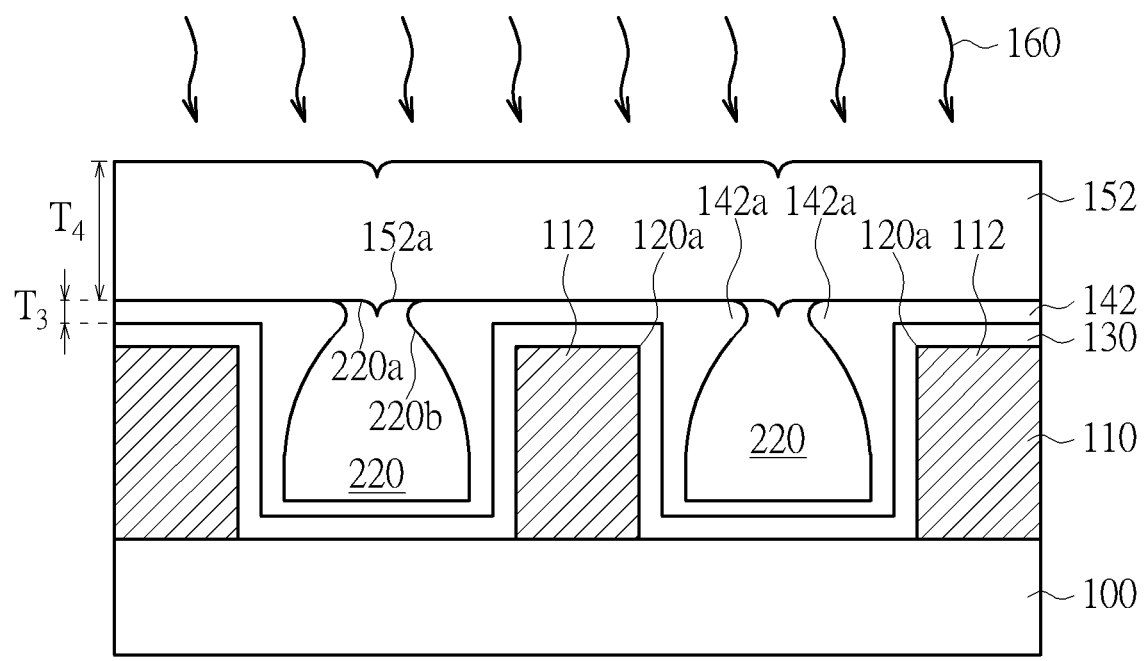

Please refer to FIG. 4. Afterward, a curing process 160 is performed on the substrate 100 to concurrently transform the first dielectric layer 140 and the second dielectric layer 150 into porous first dielectric layer 142 and second dielectric layer 152. The curing process 160 may include one or both of a thermal treatment or an ultraviolet radiation treatment. The curing process 160 may be conducted at a temperature about 300° C. to 500° C., and preferably between 350° C. and 450° C. and comprises at least an exposure to radiation of a wavelength from 10 nm to 400 nm. The processing time of the curing process 160 may be about 30 seconds to about 600 seconds, and preferably about 100 seconds. During the curing process 160, the porogens interspersed in the first dielectric layer 140 and the second dielectric layer 150 may be decomposed into gaseous compounds and then evacuate from the first dielectric layer 140 and the second dielectric layer 150 thereby leaving pores behind in the bodies of the first dielectric layer 140 and the second dielectric layer 150. Furthermore, the first dielectric layer 140 and the second dielectric layer 150 may concurrently undergo a restructuring during the curing process 160 and be transformed into porous first dielectric layer 142 and second dielectric layer 152 having pores formed by decomposition of the porogens. The curing process 160 may also impart a better mechanical strength to the first dielectric layer 142 and the second dielectric layer 152.

Because the proportions of the porogens in the first dielectric layer 140 and the second dielectric layer 150 are different, the resultant first dielectric layer 142 and second dielectric layer 152 may have different porosities and different dielectric constants. The first dielectric layer 142 may have porosity higher than that of the second dielectric layer 152, and therefore first dielectric layer 142 may have a dielectric constant smaller than that of the second dielectric layer 152. Preferably, the first dielectric layer 142 may have a dielectric constant approximately of 2.6 or less and the second dielectric layer 152 may have a dielectric constant ranging from 2.7 to 3. In other embodiments, the first dielectric layer 142 may have a dielectric constant ranging from 2.6 to 3 according to application needs.

It is noteworthy that the thickness of first dielectric layer 140 and the second dielectric layer 150 may shrink during the curing process 160. That is, the obtained first dielectric layer 142 may have a thickness $T_3$ smaller than the thickness $T_1$ of the first dielectric layer 140, and the second dielectric layer 152 may have a thickness $T_4$ smaller than the thickness $T_2$ of the second dielectric layer 150. By adjusting the proportion of the porogens in the first dielectric layer 140 and the condition of the curing process 160, a significant amount of shrinkage of the first dielectric layer 140 when being transformed into the first dielectric layer 142 may be obtained. A volume of the air gap 220 sealed in the trench 120 between the conductive structures 112 may therefore be significantly increased. According to an embodiment, the first dielectric layer 140 may shrink by about 5% to 50% of its original thickness $T_1$ after the curing process 160. The first dielectric layer 140 and the second dielectric layer 150 may have different degrees of shrinkage during the curing process 160 depending on different proportions of the porogens in the bodies. For example, the second dielectric layer 150 may have a smaller degree of shrinkage than the first dielectric layer 140 does. The shrinkage of the second dielectric layer 150 when being transformed into the second dielectric layer 152 may be about 0% to 30% of its original thickness $T_2$.

It is also noteworthy that shrinkage of the first dielectric layer 140 may result in an incensement of the volume of the air gap 200. As shown in FIG. 4, during the curing process 160, the first dielectric layer 142 covering the sidewalls and bottom surface of the trench 120 may have a reduced thickness, and the joining overhang features 142a of the first dielectric layer 142 may respectively shrink toward the upper corners 120a of the trench 120 and consequently forming an opening revealing a bottom surface 152a of the second dielectric layer 152. A bottle-shaped air gap 220 having an increased volume is therefore obtained. The bottom surface 152a of the second dielectric layer 152 is in direct contact with the air gap 220 and defines a top surface 220a of the air gap 220. The overhang features 142a of the second dielectric layer 142 at upper corners 120a of the trench 120 define a neck portion 220b of the air gap 220. The first dielectric layer 142 substantially has an upside down omega-shaped profile. Because air has a dielectric constant as low as about 1, the increased volume of the air gap 220 may further reduce the overall dielectric constant of the isolation between the conductive structures 112. Therefore, the capacitive coupling between the adjacent conductive structures 112 may be further reduced.

Figure 5:
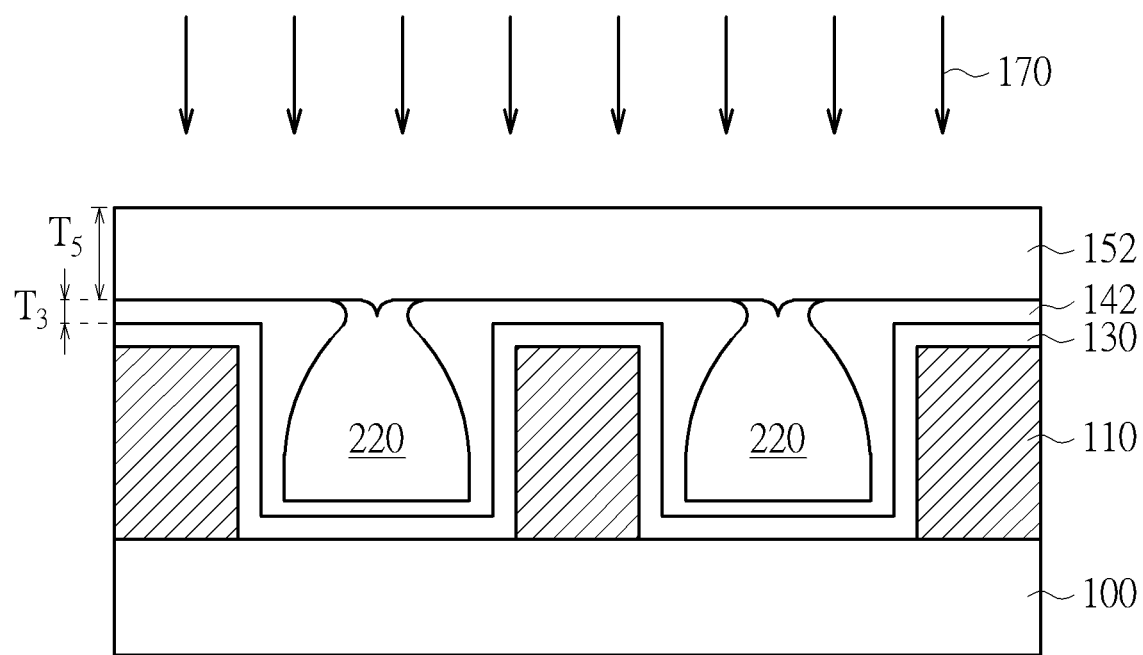

Please refer to FIG. 5. Optionally, after the curing process 160, a planarization process 170 such as a chemical mechanical polishing (CMP) process may be conducted to remove a portion of the second dielectric layer 152 until a predetermined target thickness $T_5$ of the second dielectric layer 152 is obtained. After that, subsequent processes may be conducted to form other interconnection structures (not shown) or integrated circuit components over the patterned layer 110, and would not be illustrated herein.

Figure 6:
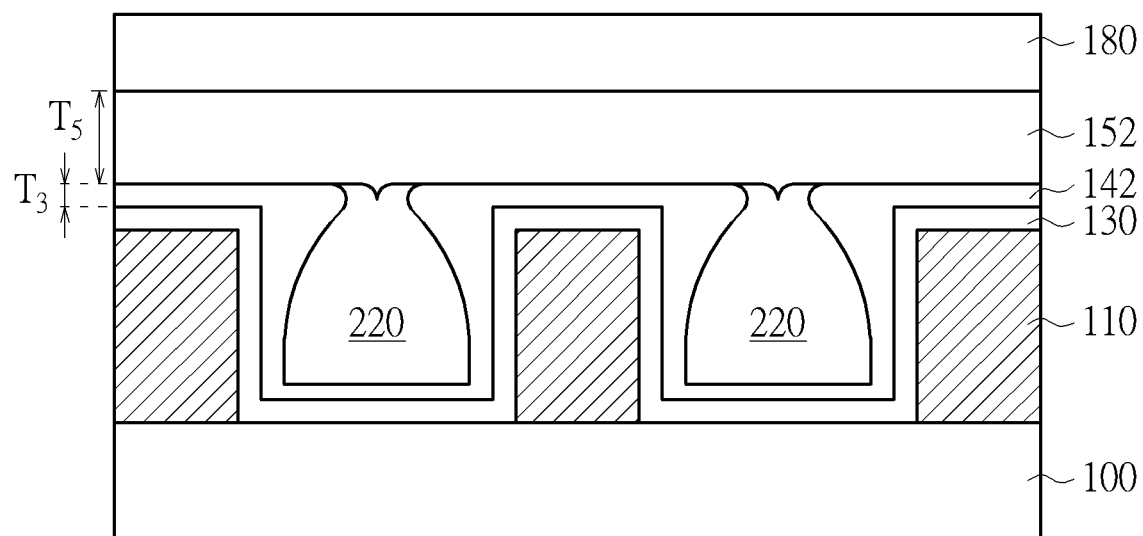
FIG. 6 is a schematic diagram illustrating a method for forming an interconnection structure according to a second embodiment of the present invention.

Please refer to FIG. 6, which is a schematic diagram illustrating a second embodiment of the present invention. Optionally, a third dielectric layer 180 may be formed on the second dielectric layer 152 after the curing process 160. The third dielectric layer 180 may be a low-k dielectric material including carbon-doped silicon dioxide materials, fluorinated silicate glass (FSG), organic polymeric thermoset materials, silicon oxycarbide, SiCOH dielectrics, fluorine doped silicon oxide, spin-on glasses, benzocyclobutene (BCB)-based polymer dielectrics, silsesquioxanes including hydrogen silsesquioxane (HSQ), methyl silsesquioxane (MSQ) and mixtures or copolymers of HSQ and MSQ, but not limited thereto. The third dielectric layer 180 may be formed on the second dielectric layer 152 after the planarization process 170. In other embodiments, the third dielectric layer 180 may be formed on the second dielectric layer 152 after the curing process 160 and then be planarized.

Figure 7:
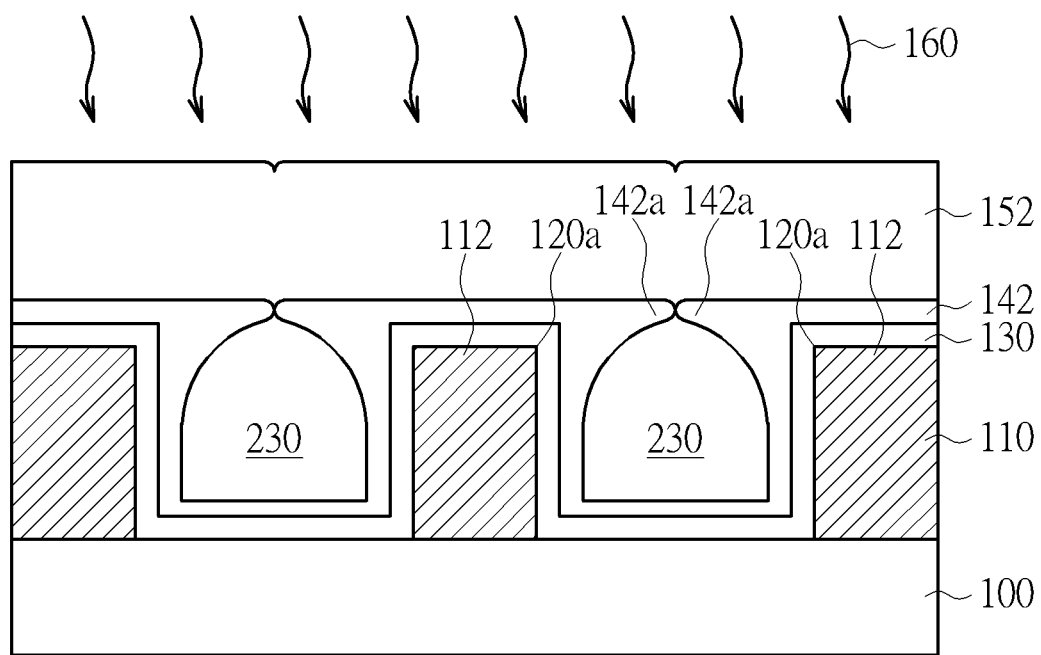
FIG. 7 is a schematic diagram illustrating a method for forming an interconnection structure according to a third embodiment of the present invention.

Please refer to FIG. 7, which is a schematic diagram illustrating a third embodiment of the present invention. The step shown in FIG. 7 corresponds to the step shown in FIG. 4 in the first embodiments. Other steps or materials of the third embodiment are substantially the same as the first embodiment. As shown in FIG. 7, similarly, a curing process 160 is performed to transform the first dielectric layer 140 and the second dielectric layer 150 into the porous first dielectric layer 142 and second dielectric layer 152 and causing a shrinkage of the first dielectric layer 140 and the second dielectric layer 150, respectively. However, the overhang features 142a of the resultant first dielectric layer 142 on the upper corners 120a of the trench 120 still join together without exposing to the air gap 230 to the second dielectric layer 152. That is, the air gap 230 is not in direct contact with the second dielectric layer 152 after the curing process 160.

Figure 8:
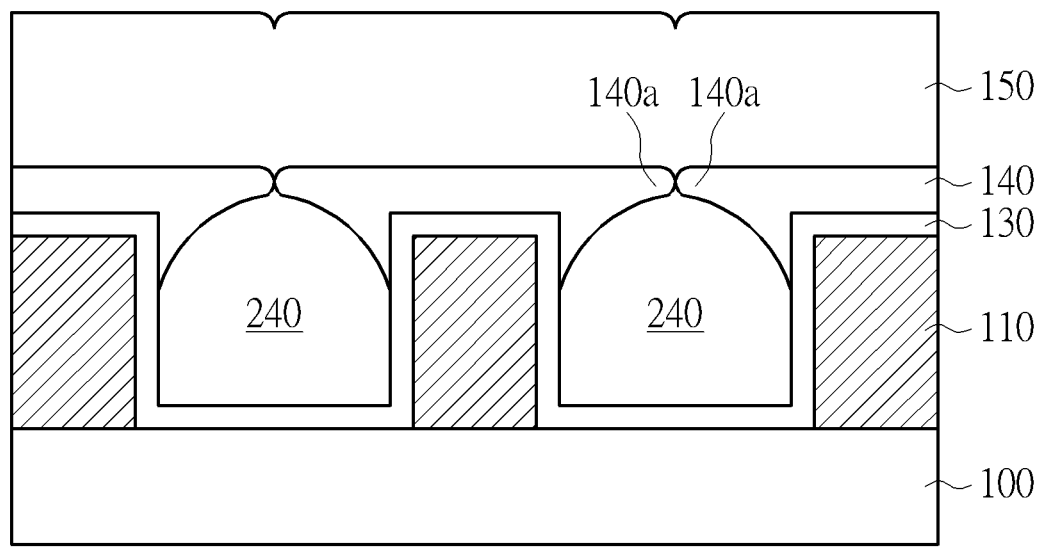
FIG. 8 to FIG. 9 are schematic diagrams illustrating a method for forming an interconnection structure according to a fourth embodiment of the present invention.
Figure 9:
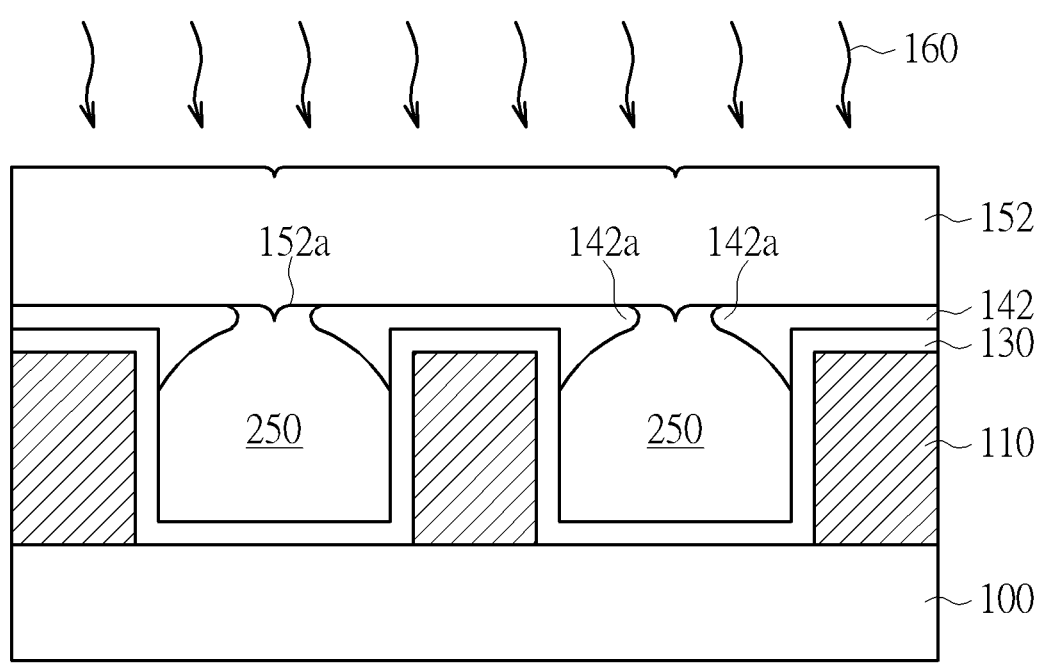

Please refer to FIG. 8 and FIG. 9, which are schematic diagrams illustrating a fourth embodiment of the present invention. The steps shown in FIG. 8 and FIG. 9 correspond to steps shown in FIG. 3 and FIG. 4 in the first embodiment. Other steps or materials of the fourth embodiment are substantially the same as the first embodiment. As shown in FIG. 8, the first dielectric layer 140 of the fourth embodiment is formed discontinuous, only covering the upper corners 120a of the trenches 120 and the top surface of the conductive structures 112 without covering the sidewalls and bottom surface of the trenches 120. This may happen while, for example, the width $W_1$ of the trench 120 between the conductive structures 112 is very small and/or the step coverage of the first dielectric layer 140 is very poor. The first dielectric layer 140 on the upper corners of the trench 120 forms overhang features 140a and thereby sealing an air gap 240 in the trench 120. The second dielectric layer 150 is then in-situ formed on the first dielectric layer 140 without filling into the trench 120. Subsequently, as shown in FIG. 9, a curing process 160 is performed to concurrently transform the first dielectric layer 140 and the second dielectric layer 150 into porous first dielectric layer 142 and second dielectric layer 152 and causing a shrinkage of the first dielectric layer 140 and the second dielectric layer 150, respectively. The joining overhang features 140a of the first dielectric layer 140 may respectively shrink toward the upper corners 120a of the trench 120 and consequently becoming the overhang features 142a and forming an opening revealing a bottom surface 152a of the second dielectric layer 152. A bottle-shaped air gap 250 having an increased volume is therefore obtained.

By adjusting the proportion of the porogens in the first dielectric layer and the condition of the curing process, a significant amount of shrinkage of the first dielectric layer when being transformed into a porous first dielectric layer may be obtained. Accordingly, a volume of the air gap enclosed in the trench by the first dielectric layer is increased, and the overall dielectric constant of the isolation between conductive structures at two sides of the trench may be further reduced and the capacitive coupling between the conductive structures is therefore eliminated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interconnection structure, comprising;
   a substrate;
   a patterned layer formed on the substrate and having at least a trench formed therein;
   a barrier layer conformally covering the patterned layer and a sidewall and a bottom surface of the trench;
   a first dielectric layer formed on the barrier layer and forming overhang features on upper corners of the trench;
   a second dielectric layer formed on the first dielectric layer, completely covering the patterned layer and striding over the trench; and
   an air gap enclosed in the trench, having a bottle-shaped profile and in direct contact with the first dielectric layer and the second dielectric layer.

2. The semiconductor structure according to claim 1, wherein a bottom surface of the second dielectric layer defines a top surface of the air gap, the overhang features of first dielectric layer on upper corners of the trench define a neck portion of the air gap.

3. The semiconductor structure according to claim 1, wherein the first dielectric layer further covers sidewalls and a bottom surface of the trench and has an upside down omega-shaped profile.

4. The semiconductor structure according to claim 1, wherein a dielectric constant of the first dielectric layer is smaller than a dielectric constant of the second dielectric layer.

5. The semiconductor structure according to claim 1, wherein the patterned layer comprises at least a pair of conductive structures that are spaced apart by the trench.

* * * * *